US010861901B2

(12) United States Patent
Wang

(10) Patent No.: US 10,861,901 B2
(45) Date of Patent: Dec. 8, 2020

(54) RESISTIVE RANDOM ACCESS MEMORY AND MANUFACTURING METHOD THEREOF

(71) Applicant: Powerchip Semiconductor Manufacturing Corporation, Hsinchu (TW)

(72) Inventor: Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/395,252

(22) Filed: Apr. 26, 2019

(65) Prior Publication Data

US 2020/0266238 A1 Aug. 20, 2020

(30) Foreign Application Priority Data

Feb. 15, 2019 (TW) .............................. 108105177 A

(51) Int. Cl.
*H01L 27/24* (2006.01)
*H01L 45/00* (2006.01)

(52) U.S. Cl.
CPC ...... *H01L 27/2436* (2013.01); *H01L 45/1253* (2013.01); *H01L 45/145* (2013.01)

(58) Field of Classification Search
CPC ... H01L 45/12; H01L 45/125; H01L 45/1253; H01L 45/14; H01L 45/145; H01L 27/24; H01L 27/243; H01L 27/2436
USPC .......................................................... 257/4
See application file for complete search history.

(56) References Cited

U.S. PATENT DOCUMENTS

| 2013/0229846 A1* | 9/2013 | Chien ................ G11C 13/0002 365/51 |
| 2014/0217611 A1* | 8/2014 | Mizukami ......... H01L 27/11578 257/774 |
| 2017/0358626 A1 | 12/2017 | Franca-Neto et al. |

FOREIGN PATENT DOCUMENTS

CN          102903845          5/2015

OTHER PUBLICATIONS

Qing Luo et al., "8-layers 3D Vertical RRAM with Excellent Scalability towards Storage Class Memory Applications," Journal of 2017 IEEE International Electron Devices Meeting (IEDM), Dec. 2017, pp. 1-4.
I. G. Baek et al., "Realization of Vertical Resistive Memory (VRRAM) using cost effective 3D Process," Journal of 2011 International Electron Devices Meeting, Dec. 2011, pp. 1-4.
(Continued)

*Primary Examiner* — Monica D Harrison
(74) *Attorney, Agent, or Firm* — JCIPRNET

(57) ABSTRACT

A resistive random access memory including a stacked structure, at least one vertical electrode, a selector element, and a plurality of resistance changeable structures is provided. The stacked structure is formed by a plurality of horizontal electrodes and a plurality of first dielectric layers stacked alternately, wherein the stacked structure has at least one channel hole extending through the horizontal electrodes and the first dielectric layers. The vertical electrode is formed in the at least one channel hole. The selector element is formed in the channel hole between the vertical electrode and the stacked structure. The resistance changeable structures are disposed on the surface of each of the horizontal electrodes and are in contact with the selector element in the channel hole.

12 Claims, 12 Drawing Sheets

(56) References Cited

OTHER PUBLICATIONS

Sung Hyun Jo et al., "Cross-Point Resistive RAM Based on Field-Assisted Superlinear Threshold Selector," Journal of IEEE Transactions on Electron Devices, vol. 62, Issue 11, Nov. 2015, pp. 1-5.
"Office Action of Taiwan Counterpart Application," dated Jul. 23, 2019, pp. 1-7.

* cited by examiner

RESISTIVE RANDOM ACCESS MEMORY AND MANUFACTURING METHOD THEREOF

CROSS-REFERENCE TO RELATED APPLICATION

This application claims the priority benefit of Taiwan application serial no. 108105177, filed on Feb. 15, 2019. The entirety of the above-mentioned patent application is hereby incorporated by reference herein and made a part of specification.

BACKGROUND

Technical Field

The disclosure relates to a random access memory and a manufacturing method thereof, and more particularly to a resistive random access memory and a manufacturing method thereof.

Description of Related Art

Resistive random access memory (RRAM) has become one of the most promising non-volatile memory technologies currently due to its superior scalability, ease of operation, low power consumption, and relatively simple process.

As shown in FIG. 1, the constitution of a conventional resistive random access memory 100 mostly includes a vertical electrode 102, a resistance changeable layer 104, a horizontal electrode 106, a bit line 108, a word line 110 composed of a metal oxide semiconductor (MOS) device, etc. The resistance changeable layer 104 is formed between the vertical electrode 102 and the horizontal electrode 106, and each vertical electrode 102 is connected to the bit line 108 for charge interpretation. The resistive random access memory 100 is controlled by the word line 110 to be on or off.

Since the resistive random access memory needs to be disposed with a selector element such as a MOS to control the current flow path, so as to prevent read failure by the resistive random access memory due to sneak current. Therefore, the volume of resistive random access memory cannot be further reduced due to the device design, resulting in limitation to the integration of resistive random access memory.

SUMMARY

The disclosure provides a resistive random access memory, which may effectively improve the integration of resistive random access memory, thereby improving the performance of devices.

The disclosure also provides a manufacturing method of a resistive random access memory, which may be integrated into existing process and produce resistive random access memory with high integration.

The resistive random access memory of the disclosure includes a stacked structure, at least one vertical electrode, a selector element, and a plurality of resistance changeable structures. The stacked structure is formed by a plurality of horizontal electrodes and a plurality of first dielectric layers stacked alternately, wherein the stacked structure has at least one channel hole extending through the horizontal electrodes and the first dielectric layers. The vertical electrode is formed in the at least one channel hole. The selector element is formed in the channel hole between the vertical electrode and the stacked structure. The resistance changeable structures are disposed on the surface of each of the horizontal electrodes and are in contact with the selector element in the channel hole.

In an embodiment of the disclosure, the resistance changeable structure includes a storage layer, an oxide layer disposed between the storage layer and the selector element, and a barrier layer disposed between the storage layer and the surface of the horizontal electrode.

In an embodiment of the disclosure, the selector element includes a transition metal oxide (TMO) selector element, an ovonic threshold switching (OTS) selector element, a metal/silicon/metal (MSM) selector element, or a mixed ionic electronic conduction (MIEC) diode.

In an embodiment of the disclosure, the selector element includes a gate layer in contact with the vertical electrode, a channel layer in contact with the oxide layer, and a gate insulating layer disposed between the channel layer and the gate layer.

In an embodiment of the disclosure, the selector element may further include a first conductive type doped region and a first conductive type epitaxial layer. The first conductive type doped region is formed in the channel layer at a first end of the channel hole, wherein the channel layer has a second conductive type. The first conductive type epitaxial layer is formed at a second end of the channel hole. The first conductive type epitaxial layer is in contact with the channel layer and is isolated from the gate layer by the gate insulating layer, wherein the gate layer has the first conductive type.

In an embodiment of the disclosure, the first conductive type is N-type and the second conductive type is P-type.

In an embodiment of the disclosure, the first conductive type is P-type and the second conductive type is N-type.

A manufacturing method of a resistive random access memory according to the disclosure includes the following steps. A stacked structure is formed, the stacked structure is formed by a plurality of first dielectric layers and a plurality of second dielectric layers stacked alternately, wherein the first dielectric layer and the second dielectric layer have different etch rates. At least one channel hole is formed in the stacked structure, the channel hole extends through the plurality of first dielectric layers and the plurality of second dielectric layers. A selector element is conformally formed on an inner face of the channel hole. A vertical electrode is formed in the channel hole. All of the second dielectric layers in the stacked structure are removed and a portion of the selector element is exposed. A plurality of resistance changeable structures is conformally formed on a surface of the plurality of first dielectric layers in the stacked structure and an exposed surface of the selector element, the plurality of resistance changeable structures is in contact with the selector element in the channel hole. A plurality of horizontal electrodes is formed between the plurality of first dielectric layers.

In another embodiment of the disclosure, the step of forming the resistance changeable structures includes sequentially forming an oxide layer, a storage layer, and a barrier layer on the surface of the first dielectric layers and the exposed surface of the selector element.

In another embodiment of the disclosure, the selector element includes a TMO selector element, an OTS selector element, an MSM selector element, or a MIEC diode.

In another embodiment of the disclosure, the step of forming the selector element includes sequentially forming a channel layer, a gate insulating layer, and a gate layer on an inner surface of at least one of the channel holes.

In another embodiment of the disclosure, the step of forming the selector element may further include forming a first conductive type epitaxial layer at a first end of the channel hole before forming the channel layer and doping the channel layer at a second end of the channel hole after forming the channel layer to form a first conductive type doped region, wherein the channel layer has a second conductive type.

In another embodiment of the disclosure, the first conductive type is N-type and the second conductive type is P-type.

In another embodiment of the disclosure, the first conductive type is P-type and the second conductive type is N-type.

In another embodiment of the disclosure, if the channel hole is a plurality of channel holes, the step after forming the vertical electrode further includes removing the stacked structure between each pair of channel holes and retaining the stacked structure in a portion surrounding the channel holes where a plurality of horizontal electrodes is to be formed.

Based on the above, the disclosure forms the selector element in the channel hole between the vertical electrode and the stacked structure of the resistive random access memory, and allows the resistance changeable structure to be formed on the surface of each horizontal electrode. In this way, as compared to known resistive random access memory, the volume required for the resistive random access memory may be effectively reduced using the design and process of the disclosure, thereby improving the integration of memory elements.

To make the aforementioned and other features of the disclosure more comprehensible, several embodiments accompanied with drawings are described in detail as follows.

DETAILED DESCRIPTION OF DISCLOSED EMBODIMENTS

Figure 1:
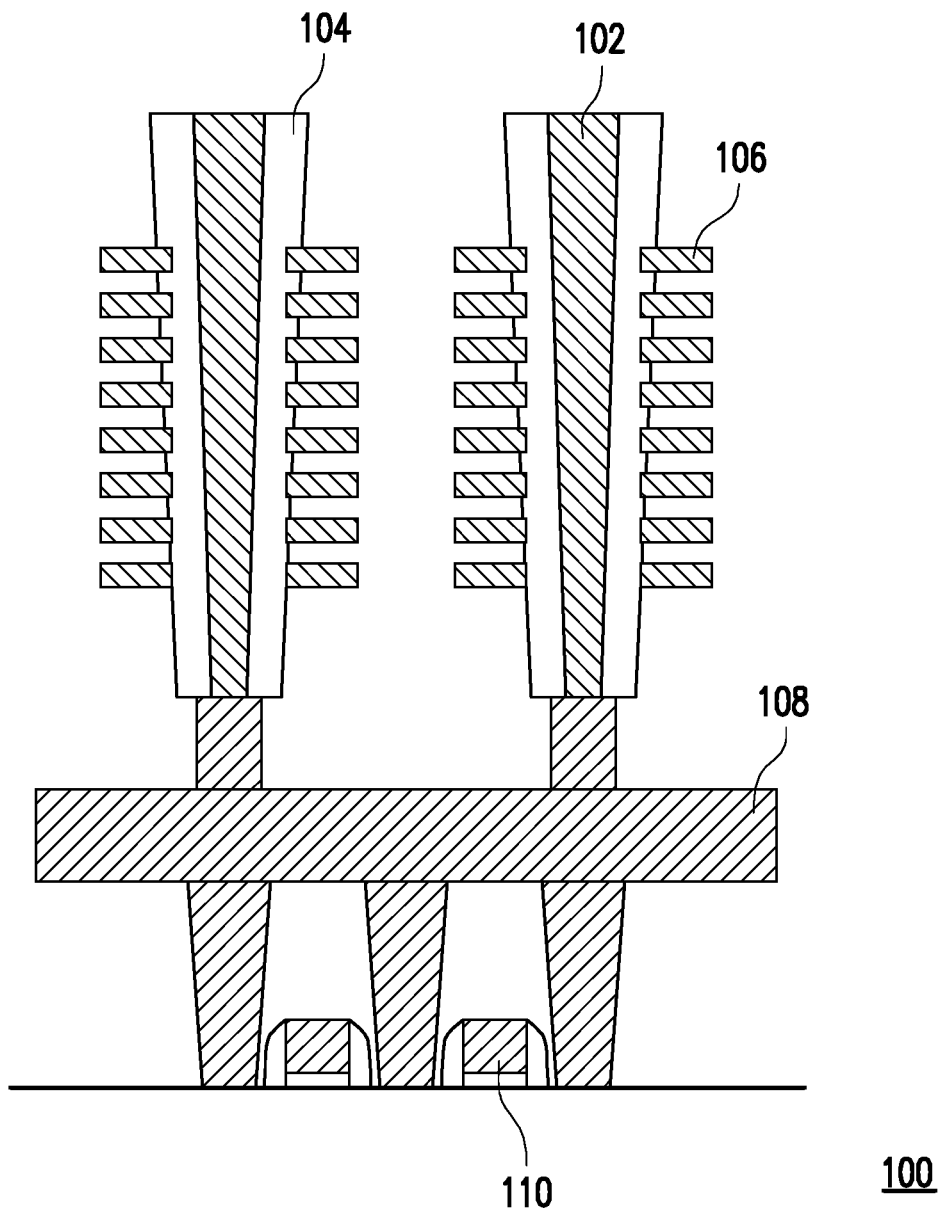
FIG. 1 is a schematic view of a conventional resistive random access memory.

The embodiments are described in detail below with reference to the drawings, but the embodiments are not intended to limit the scope of the disclosure. In addition, the drawings are for illustrative purposes only and are not drawn to the original dimensions. For the ease of understanding, the same elements are denoted by the same reference numerals in the following description. In addition, terms such as "comprising", "including", "having", etc. used in the disclosure are all open terms; which indicate to include but not to limit. Moreover, directional terms such as "up", "down", etc. used in the disclosure are only used to refer to the direction of the drawings. Therefore, the directional terms used are for illustrative purposes only but not to limit the disclosure.

Figure 2:
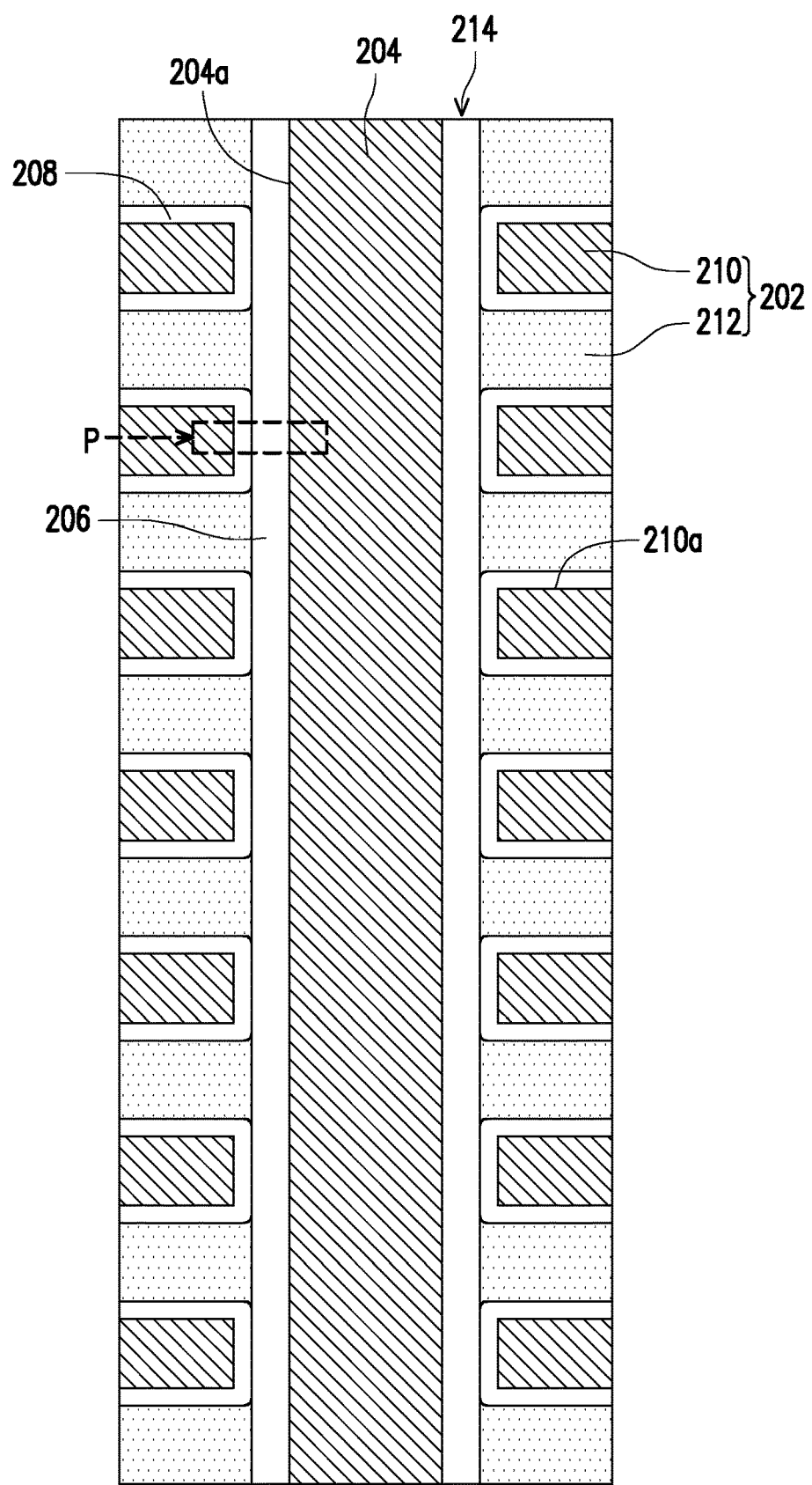
FIG. 2 is a cross-sectional schematic view of a resistive random access memory according to the first embodiment of the disclosure.
Figure 3:
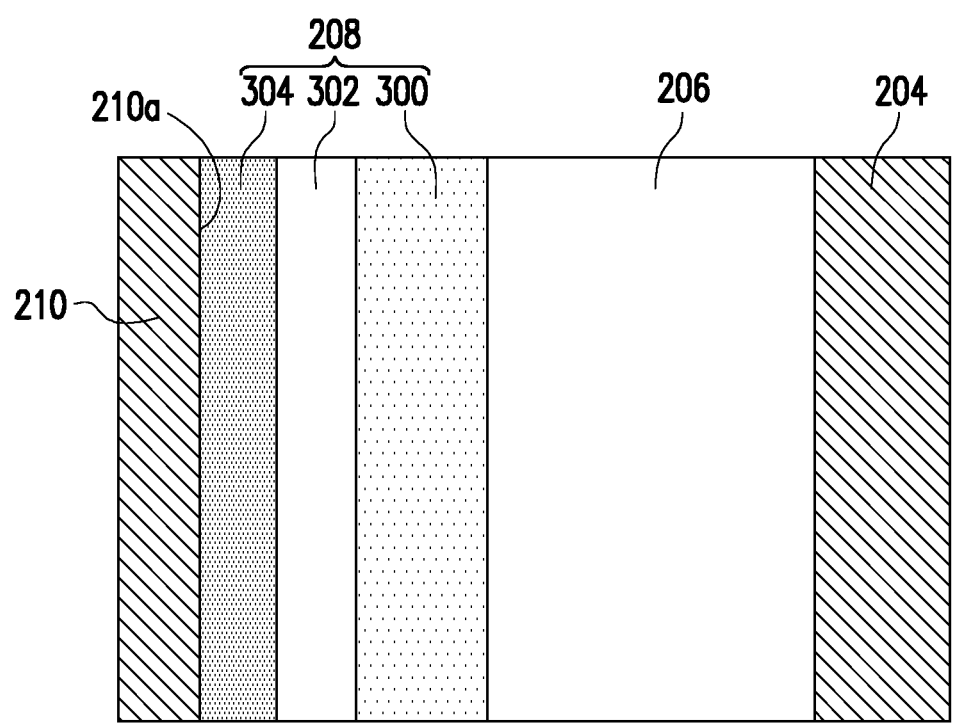
FIG. 3 is an enlarged schematic view of a portion P of FIG. 2.

FIG. 2 is a cross-sectional schematic view of a resistive random access memory according to the first embodiment of the disclosure. FIG. 3 is an enlarged schematic view of a portion P of FIG. 2.

Referring to FIG. 2, a resistive random access memory 200 of the first embodiment includes a stacked structure 202, at least one vertical electrode 204, a selector element 206, and a plurality of resistance changeable structures 208. It shall be stated that although FIG. 2 only illustrates one vertical electrode 204, the number of vertical electrodes 204 may be adjusted according to process design requirements and the disclosure is not limited thereto.

In the embodiment, the stacked structure 202 is formed by a plurality of horizontal electrodes 210 and a plurality of first dielectric layers 212 stacked alternately. It shall be noted that the number of the horizontal electrodes 210 and the first dielectric layers 212 illustrated in FIG. 2 is respectively 7 layers and 8 layers, and the horizontal electrodes 210 and the first dielectric layers 212 are stacked on each other along the direction perpendicular to a surface 204a of the vertical electrode 204. However, in other embodiments, the number of layers and stacking manner of the horizontal electrodes 210 and the first dielectric layers 212 may change according to process design requirements, and are not limited to as shown in FIG. 2.

In the embodiment, the stacked structure 202 has a channel hole 214 extending through the plurality of horizontal electrodes 210 and the plurality of first dielectric layers 212, and the vertical electrode 204 is formed in the channel hole 214. The material of the vertical electrode 204 is, for example, W, TiN, Poly-Si, Pt, etc., but the disclosure is not limited thereto. The material of the horizontal electrode 210 is, for example, W, TiN, Poly-Si, etc., but the disclosure is not limited thereto. In addition, the selector element 206 is formed in the channel hole 214 between the vertical electrode 204 and the stacked structure 202, and a plurality of resistance changeable structures 208 is disposed on a surface 210a of each of the horizontal electrodes 210 and is in contact with the selector element 206 in the channel hole 214. As such, the selector element 206 may be formed in the limited space (in the channel hole 214) and the resistance changeable structures 208 may be formed outside the channel hole 214 to effectively reduce the space required for the resistive random access memory, thereby effectively improving the integration of memory elements.

In the embodiment, the selector element 206 is, for example, a TMO selector element, an OTS selector element, an MSM selector element, or a MIEC diode. The aforementioned selector element may be a single-layered structure, a double-layered structure, a triple-layered structure, etc. The transition metal oxide (TMO) is, for example, TaOx, TiOx, HfOx, or HfOx/TaOx, but the disclosure is not limited thereto. As long as the selector element 206 may be formed in the channel hole 214 between the vertical electrode 204 and the stacked structure 202 for controlling the current flow path flowing through the resistive random access memory 200 to prevent the generation of sneak current, the disclosure is not limited thereto.

Referring to FIG. 3, the detailed structure of the resistance changeable structure 208 is, for example, an oxide layer 300, a storage layer 302, and a barrier layer 304. The oxide layer 300 is disposed between the storage layer 302 and the selector element 206. The barrier layer 304 is disposed between the storage layer 302 and the surface 210a of the horizontal electrode 210. For example, the oxide layer 300 is a silicon oxide layer, the storage layer 302 is a titanium oxynitride layer, and the barrier layer 304 is a titanium nitride layer, but the disclosure is not limited thereto. In other embodiments, the layer number and material of the stacked material layers of the resistance changeable structure 208 may be adjusted according to process design requirements.

Figure 4:
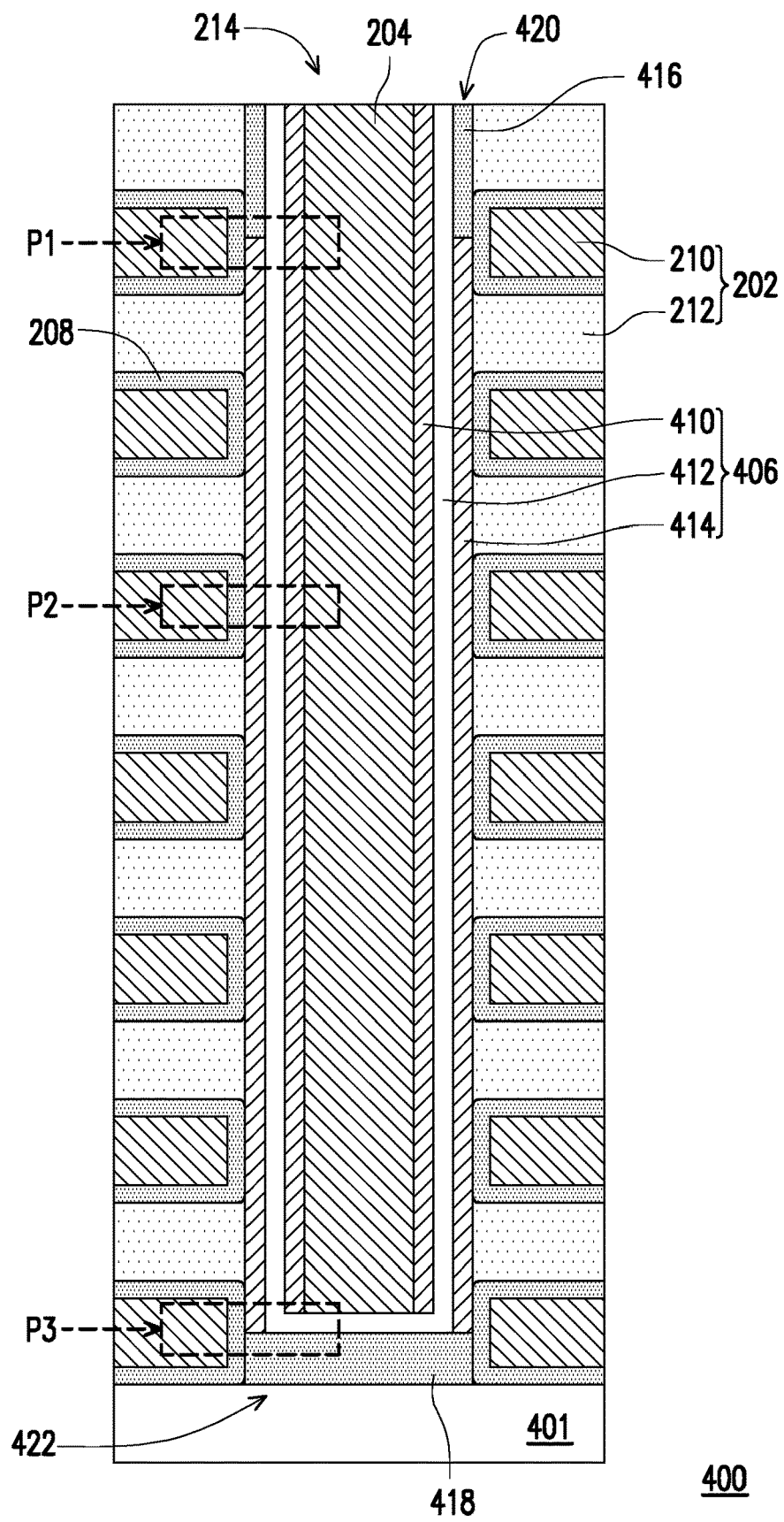
FIG. 4 is a cross-sectional schematic view of a resistive random access memory according to the second embodiment of the disclosure.
Figure 5A:
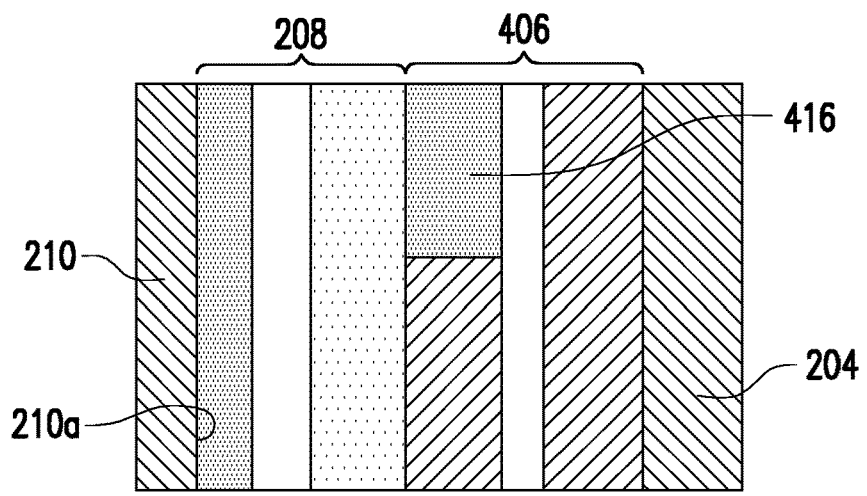
FIG. 5A, FIG. 5B, and FIG. 5C are respectively a portion P1, a portion P2, and a portion P3 of FIG. 4.
Figure 5B:
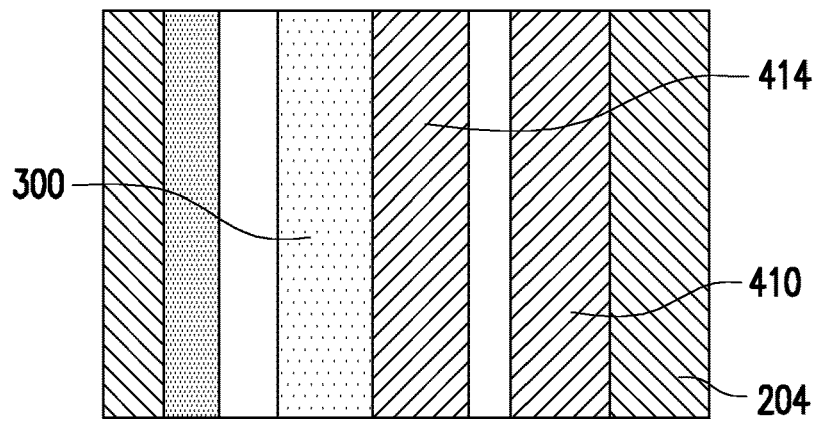
Figure 5C:
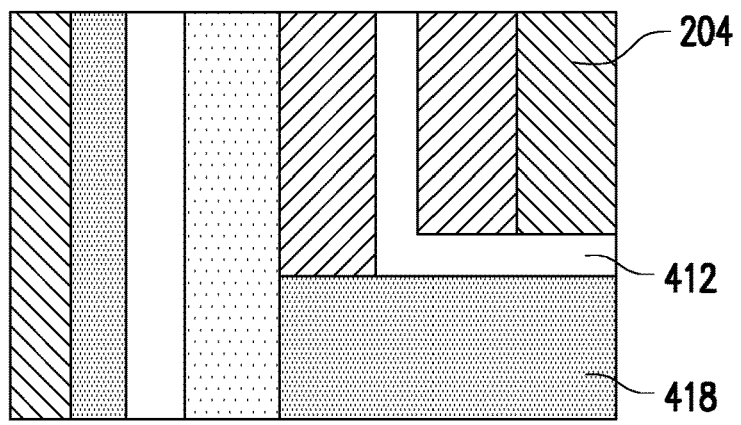

FIG. 4 is a cross-sectional schematic view of a resistive random access memory according to a second embodiment of the disclosure. FIG. 5A, FIG. 5B, and FIG. 5C are respectively a portion P1, a portion P2, and a portion P3 of FIG. 4.

Referring to FIG. 4, the difference between a resistive random access memory 400 and the resistive random access memory 200 lies in the difference between the structure of a selector element 406 and the structure of the selector element 206. For example, the selector element 406 is, for example, a MOS device including a gate layer 410, a gate insulating layer 412, and a channel layer 414. The gate layer 410 is in contact with the vertical electrode 204, the channel layer 414 is in contact with the oxide layer 300 (as shown in FIG. 5B), and the gate insulating layer 412 is disposed between the channel layer 414 and the gate layer 410. Since the MOS device of the second embodiment is present in the channel hole 214, as compared to FIG. 1 which sets the MOS device in another position, the volume required by the resistive random access memory according to the second embodiment may be significantly reduced, thereby improving the integration of memory elements.

Referring to FIGS. 5A-5C, in the embodiment, the selector element 406 may further include a first conductive type doped region 416 and a first conductive type epitaxial layer 418. The first conductive type doped region 416 is formed in the channel layer 414 at a first end 420 (i.e. FIG. 4) of the channel hole 214 away from a substrate 401 side, wherein the channel layer 414 has a second conductive type. The first conductive type epitaxial layer 418 is formed at a second end 422 (i.e. FIG. 4) of the channel hole 214 close to the substrate 401 side. The first conductive type epitaxial layer 418 is in contact with the channel hole layer 414 and is isolated from the gate layer 410 by the gate insulating layer 412, wherein the gate layer 410 has a first conductive type.

In an embodiment, the first conductive type is, for example, N-type and the second conductive type is, for example, P-type. In another embodiment, the first conductive type is, for example, P-type and the second conductive type is, for example, N-type. The first conductive type and the second conductive type may be adjusted according to process design requirements, and the disclosure is not limited thereto.

A resistive random access memory of the disclosure includes forming a selector element in a channel hole between a vertical electrode and a stacked structure, and disposing a plurality of resistance changeable structures on a surface of each of the horizontal electrodes to be in contact with the selector element in the channel hole. Accordingly, in addition to preventing read failure due to sneak current, the required distance and space between memory elements may also be effectively reduced, thereby effectively improving the integration of memory elements.

FIG. 6A to FIG. 6F are cross-sectional schematic views of a manufacturing process of a resistive random access memory according to the second embodiment of the disclosure.

Figure 6A:
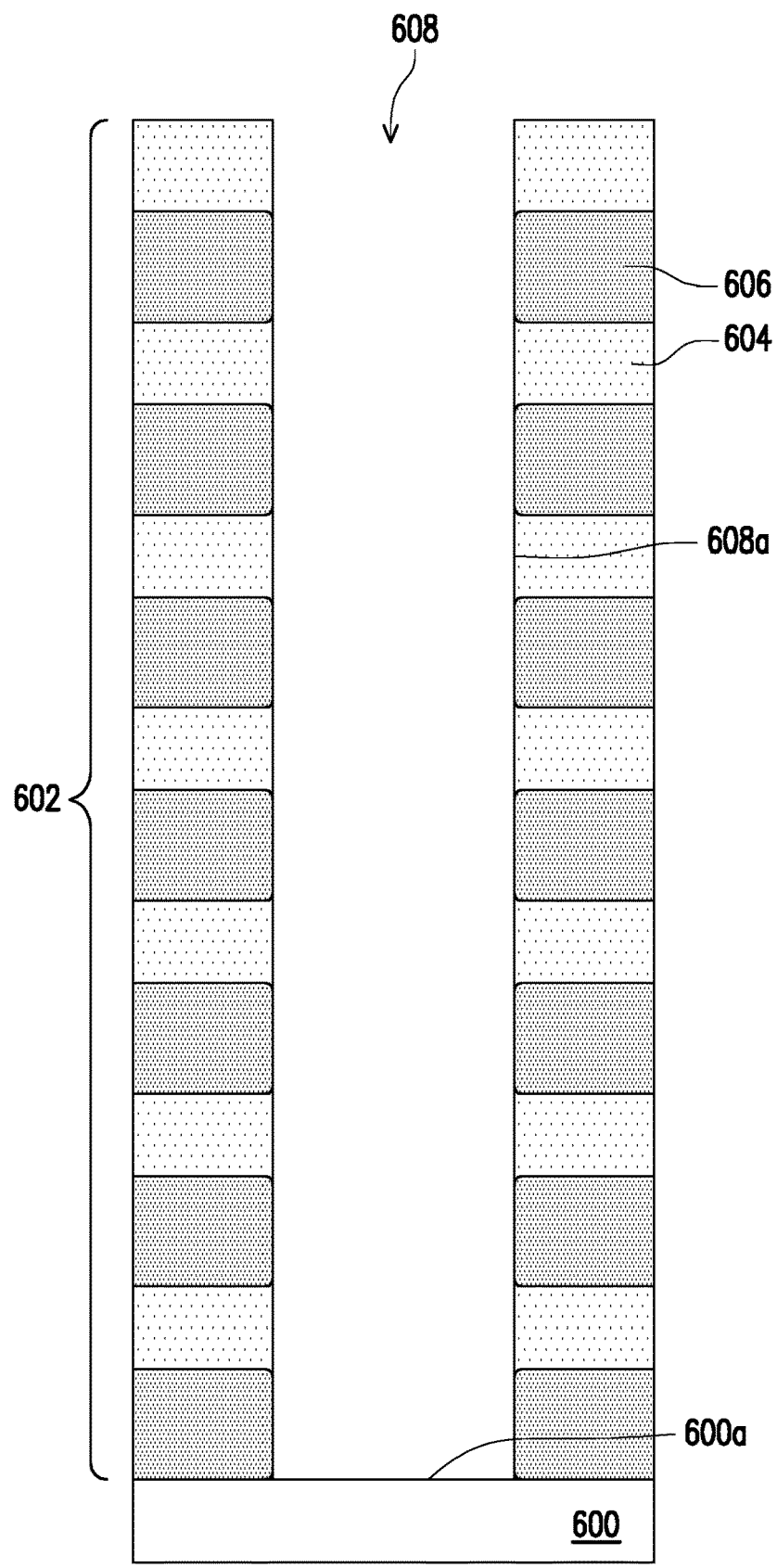
FIG. 6A to FIG. 6F are cross-sectional schematic views of a manufacturing process of a resistive random access memory according to the second embodiment of the disclosure.

Referring to FIG. 6A first, a stacked structure 602 is first formed on a substrate 600. The stacked structure 602 is formed by a plurality of first dielectric layers 604 and a plurality of second dielectric layers 606 stacked alternately, wherein the first dielectric layer 604 and the second dielectric layer 606 have different etch rates. For example, the material of the first dielectric layer 604 is silicon oxide and the material of the second dielectric layer 606 is W, TiN, etc. It shall be noted that although the number of the first dielectric layers 604 and the second dielectric layers 606 as illustrated in FIG. 6A is both 7 layers, and the first dielectric layers 604 and the second dielectric layers 606 are stacked alternately, in other embodiments, the number of layers and stacking manner of the first dielectric layers 604 and the second dielectric layers 606 may be changed according to process design requirements, and are not limited thereto.

Next, at least one channel hole 608 is formed in the stacked structure 602 using a method such as dry etch, such that the channel hole 608 extends through the plurality of first dielectric layers 604 and the plurality of second dielectric layers 606. In the embodiment, the formed channel hole 608 exposes a surface 600a of the substrate 600.

Figure 6B:
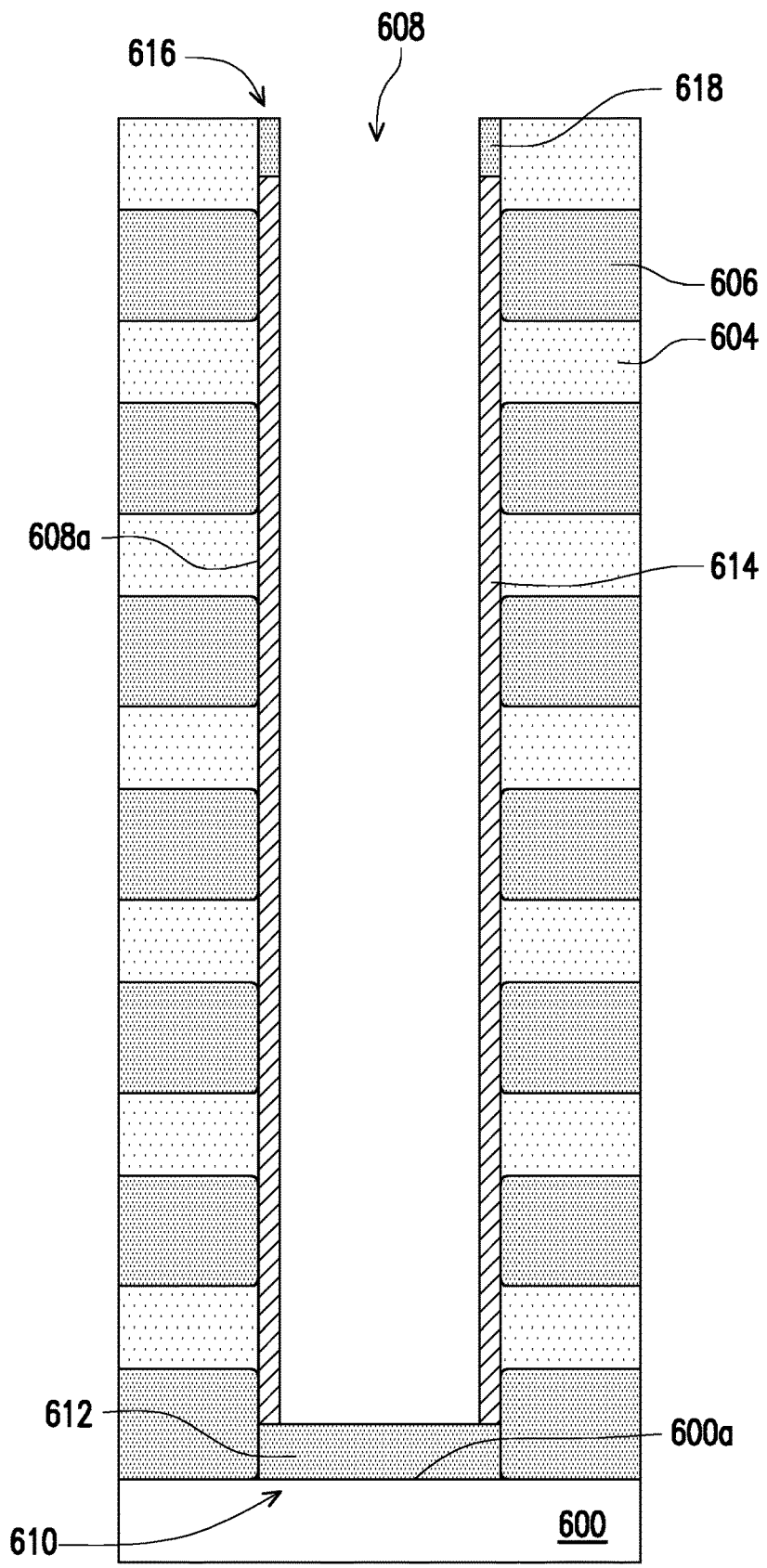

Then, referring to FIG. 6B, in order to conformally form the selector element on an inner surface 608a of the channel hole 608, a first conductive type epitaxial layer 612 may first be formed at a first end 610 of the channel hole 608. The method of forming the first conductive type epitaxial layer 612 is, for example, forming an epitaxial structure having a dopant on a surface 600a of the substrate 600 using an epitaxial process; or forming a polysilicon layer (not shown) first between the substrate 600 and the stacked structure 602, then allowing the channel hole 608 to extend through the polysilicon layer to the surface 600a when the channel hole 608 is being formed before performing the epitaxial process. Next, a channel layer 614 is formed on the inner surface 608a of the channel hole 608. Then, the channel layer 614 at a second end 616 of the channel hole 608 is doped to form a first conductive type doped region 618, wherein the channel layer 614 has a second conductive type. In an embodiment, the first conductive type is, for example, N-type and the second conductive type is, for example, P-type. In another embodiment, the first conductive type is, for example, P-type and the second conductive type is, for example, N-type. The first conductive type and the second conductive type may be adjusted according to process design requirements, and the disclosure is not limited thereto.

Figure 6C:
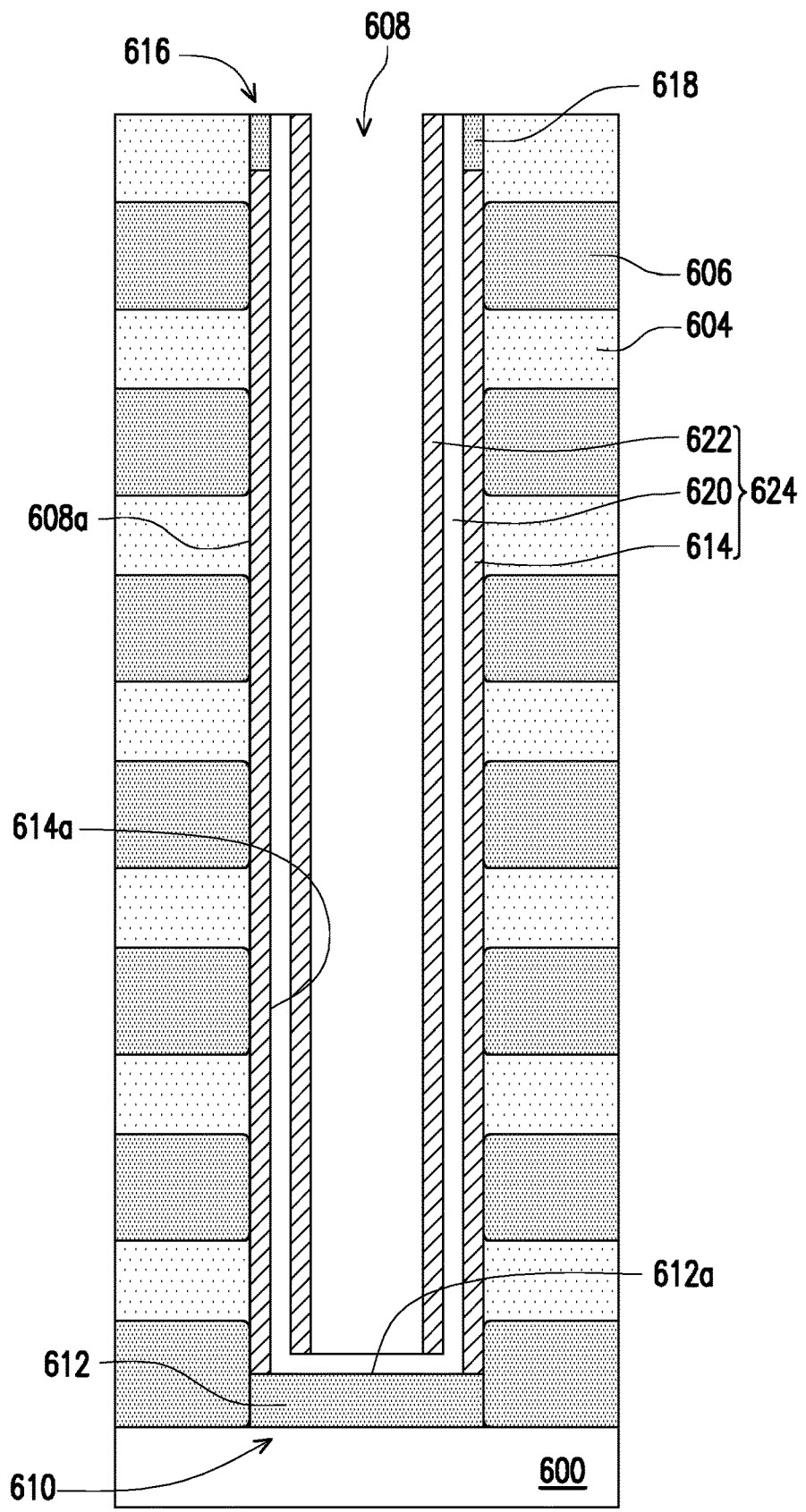

Next, referring to FIG. 6C, a gate insulating layer 620 and a gate layer 622 are sequentially formed in the channel hole 608. For example, the gate insulating layer 620 is conformally formed on a surface 614a of the channel layer 614 and a surface 612a of the first conductive type epitaxial layer 612, and the gate layer 622 is formed on the inner surface 608a of the channel hole 608.

After the process shown in FIG. 6A to FIG. 6C, a selector element 624, such as a MOS, may be formed on the inner face 608a of the channel hole 608, wherein the first conductive type epitaxial layer 612 at the first end 610 and the first conductive type doped region 618 at the second end 616 serve as a source and a drain, but the disclosure is not limited thereto.

In other embodiments, other selector elements (not shown), such as a TMO selector element, an OTS selector element, an MSM selector element, or a MIEC diode, may also be conformally deposited on the inner surface 608a of the channel hole 608 after the channel hole 608 of FIG. 6A is formed. These selector elements may be single-layered structures, double-layered structures, triple-layered structure, etc. without the need of the source and the drain in FIG. 6C. As long as the formed selector element can control the current flow path flowing through the resistive random access memory to prevent the generation of sneak current, the disclosure is not limited thereto.

Subsequently, referring to FIG. 6D, a vertical electrode 626 is formed in the channel hole 608. For example, the vertical electrode 626 fills the channel hole 608 and is in contact with the selector element 624.

Figure 6D:
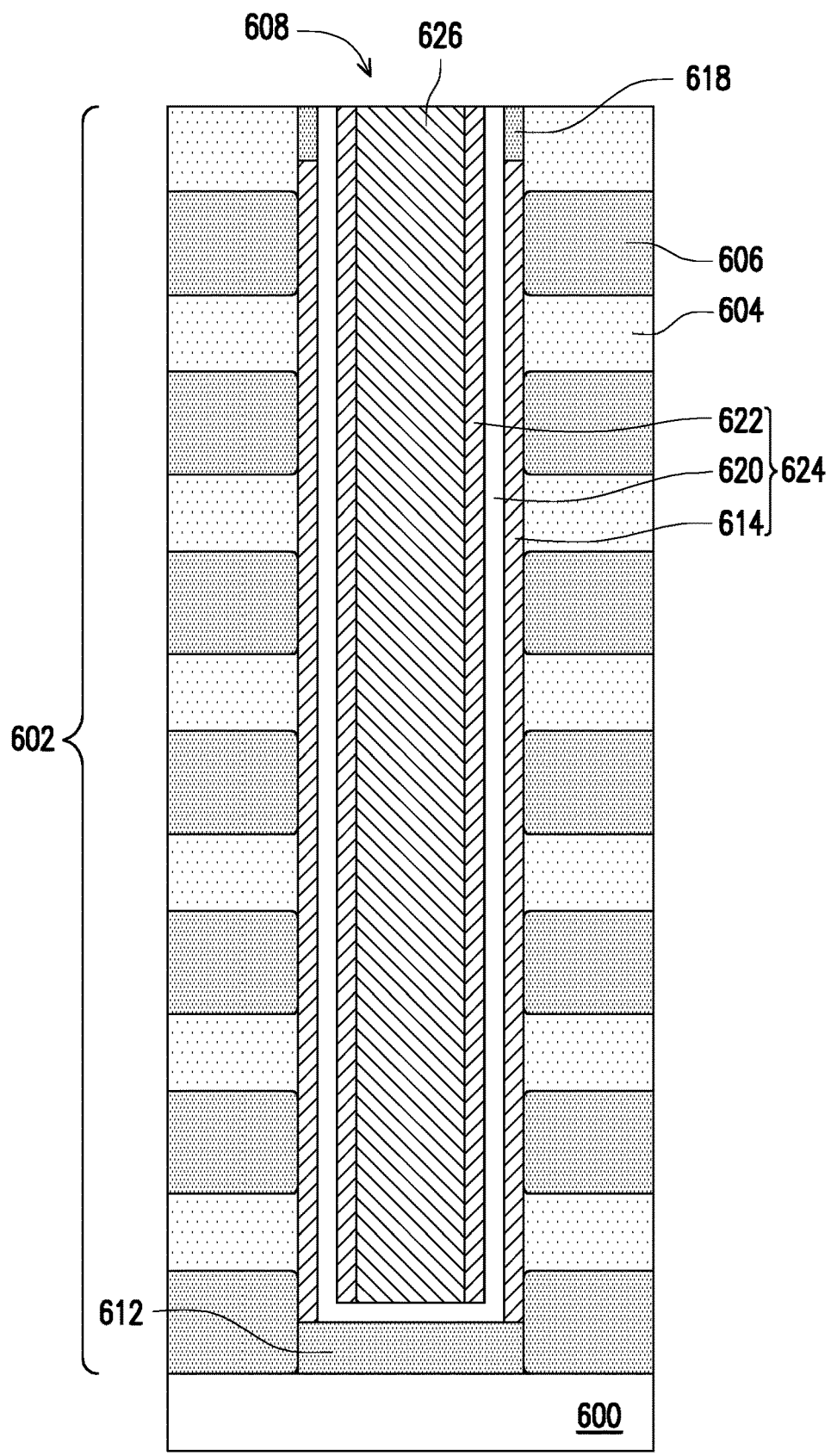
Figure 6E:
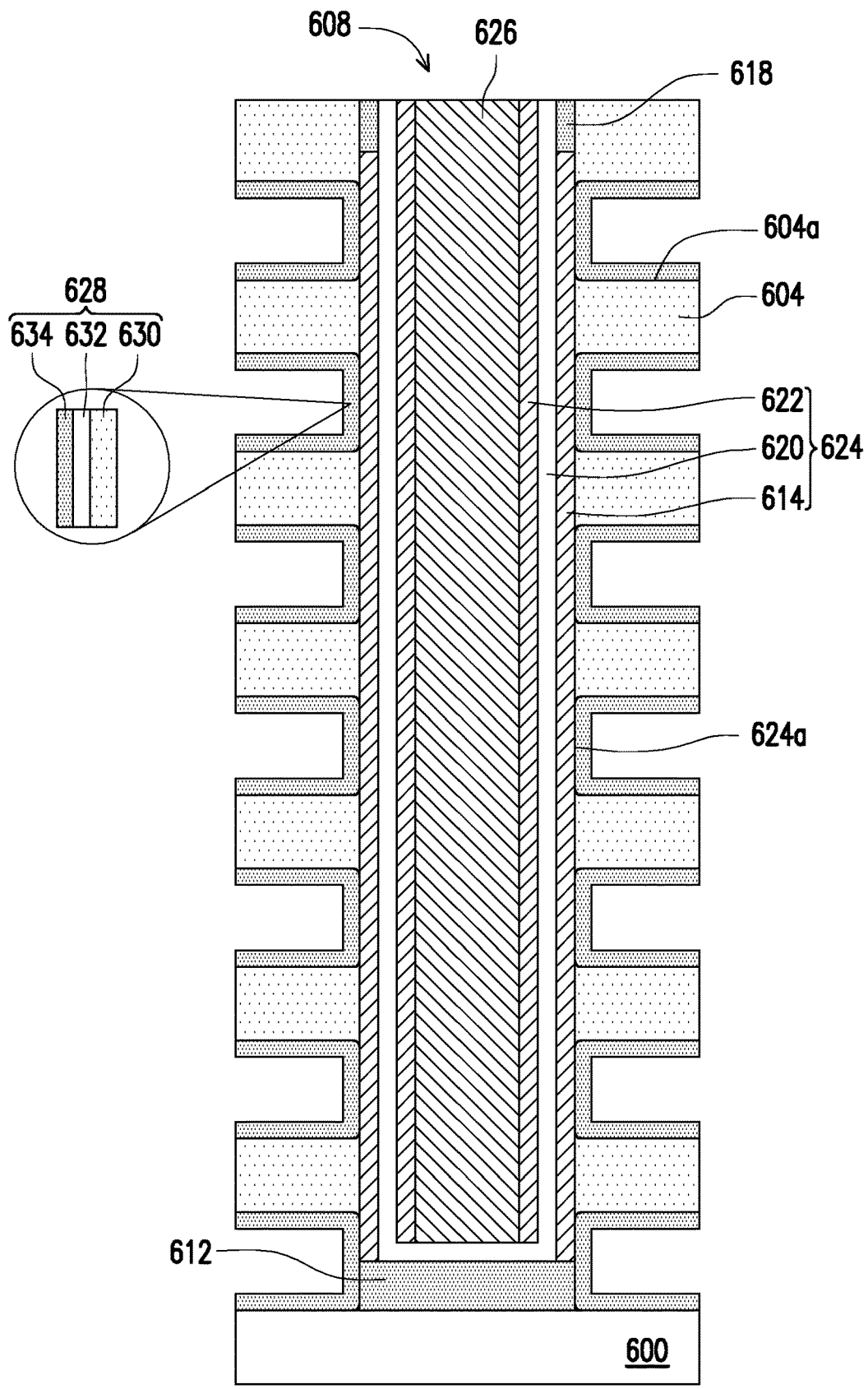

Then, referring to FIG. 6E, the plurality of second dielectric layers 606 in the stacked structure 602 is removed and a portion of the selector element 624 is exposed. The method of removing the second dielectric layers 606 is, for example, wet etch or any method using the etch selectivity ratios of the first dielectric layers 604 and the second dielectric layers 606 to selectively remove the second dielectric layers 606. Subsequently, a plurality of resistance changeable structures 628 is conformally formed on a surface 604a of the first dielectric layer 604 in the stacked structure 602 and an exposed surface 624a of the selector element 624. The plurality of resistance changeable structures 628 is in contact with the selector element 624 in the channel hole 608. In the embodiment, the method of forming the resistance changeable structure 628 is, for example, sequentially forming an oxide layer 630, a storage layer 632, and a barrier layer 634 on the surface 604a of the first dielectric layer 604 and the exposed surface 624a of the selector element 624, but the disclosure is not limited thereto. The materials of the aforementioned layers may be adjusted according to process design requirements. For example, the oxide layer 630 is a silicon oxide layer, the storage layer 632 is a titanium oxynitride layer, and the barrier layer 634 is a titanium nitride layer, but the disclosure is not limited thereto. In other embodiments, the layer number and material of the stacked material layers of the resistance changeable structures 628 may also be adjusted according to process design requirements.

Figure 6F:
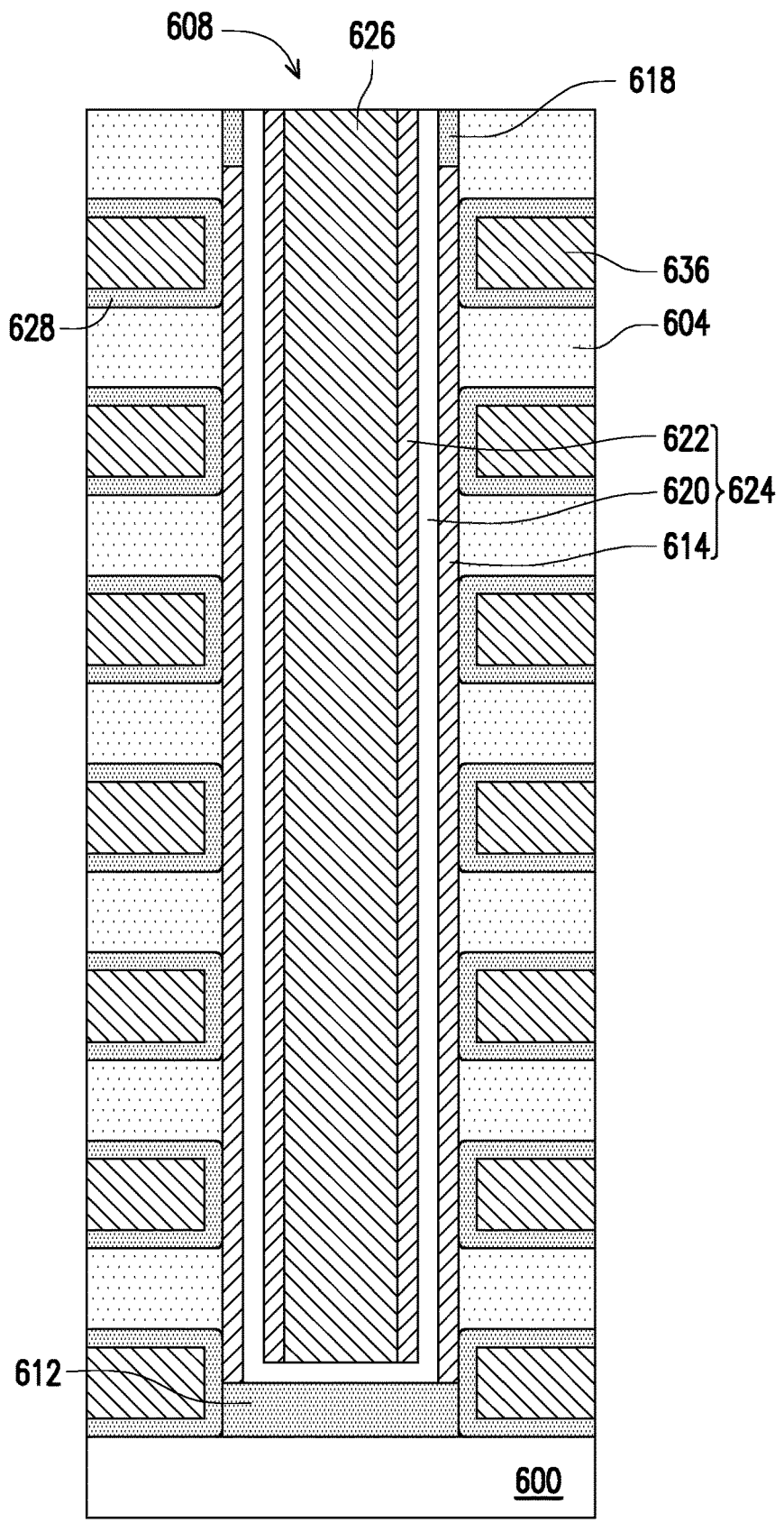

Next, referring to FIG. 6F, horizontal electrodes 636 are formed between the first dielectric layers 604. The method of forming the horizontal electrodes 636 is, for example, filling tungsten by atomic layer deposition (ALD) and removing excess tungsten by etch back to let the edge of the horizontal electrode aligned with the edges of the resistance changeable structure 628 and the first dielectric layer 604. So far, the process of the resistive random access memory is mostly completed.

Figure 7:
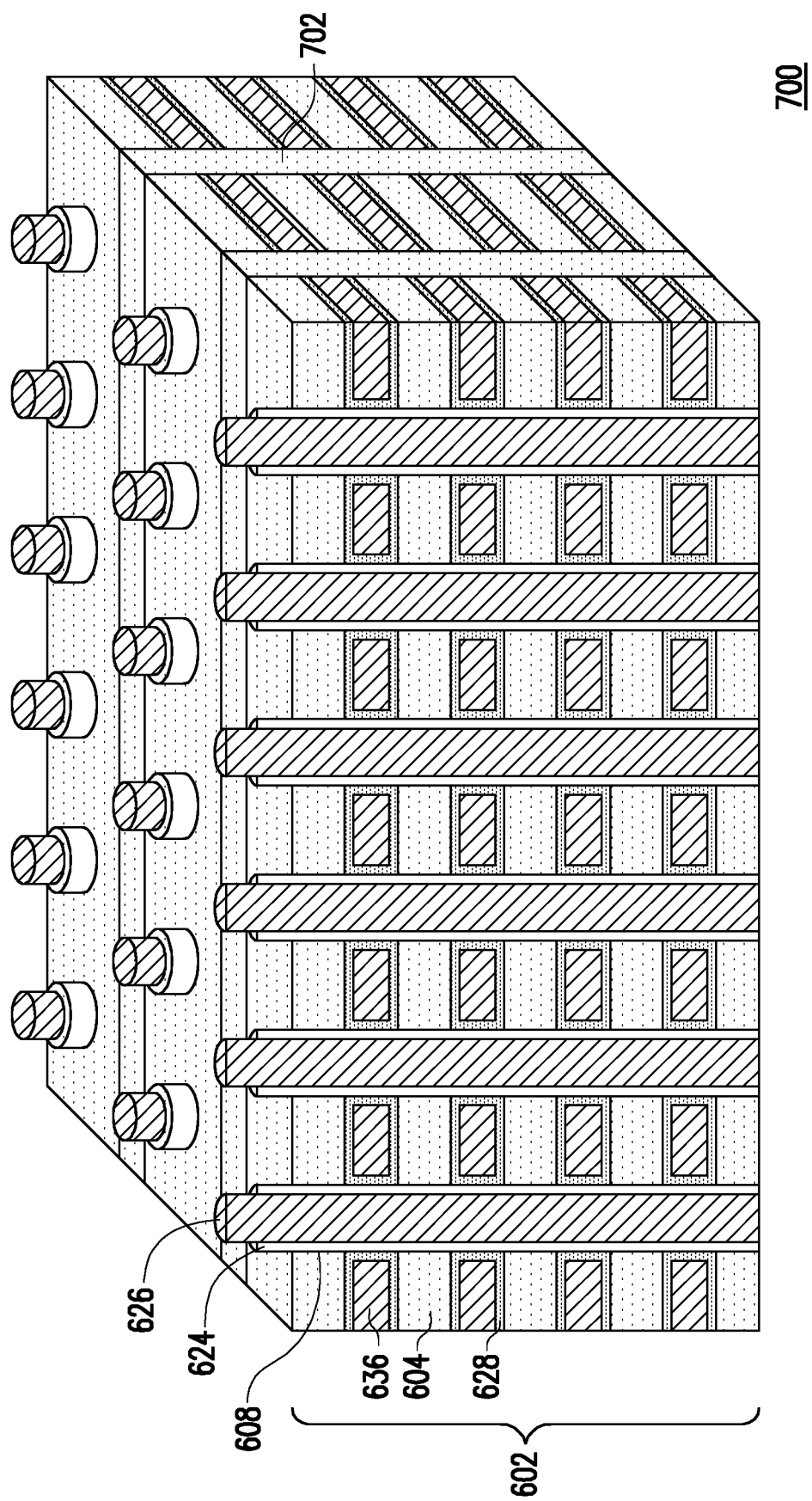
FIG. 7 is a perspective schematic view of a resistive random access memory according to the second embodiment of the disclosure.

FIG. 7 is a perspective schematic view of a resistive random access memory according to the second embodiment of the disclosure, wherein the same or similar elements as those in FIG. 6A to FIG. 6F are denoted by the same reference numerals. Also, some technical illustrations, such as the size, material, function, etc. of each layer or region, have been omitted. Please refer to FIG. 6A to FIG. 6F for the relevant contents thereof, which shall not be reiterated in the following.

Referring to FIG. 7, if the channel hole 608 is a plurality of channel holes, the stacked structure 602 between each pair of channel holes 608 may first be removed after forming the vertical electrode 626 (as shown in FIG. 6D), and the stacked structure 602 in the portion surrounding the plurality of channel holes 608 where the horizontal electrode 636 is to be formed is retained. Thereafter, the process of FIG. 6E to FIG. 6F is performed to form a resistive random access memory 700 as shown in the drawings, wherein memories in the same row have electrical connections while memories in different rows are electrically isolated. For example, the removed portion of the stacked structure 602 may be otherwise filled with an insulating material 702 as an isolation structure.

Based on the above, the disclosure forms the selector element in the channel hole between the vertical electrode and the stacked structure of the resistive random access memory, and disposes the plurality of resistance changeable structures on the surface of each of the horizontal electrodes. In this way, the volume required for the resistive random access memory may be effectively reduced through the disclosure, thereby improving the integration of memory elements.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A resistive random access memory, comprising:
   a stacked structure formed by a plurality of horizontal electrodes and a plurality of first dielectric layers stacked alternately, wherein the stacked structure has at least one channel hole extending through the plurality of horizontal electrodes and the plurality of first dielectric layers;
   at least one vertical electrode formed in the at least one channel hole;
   a selector element formed in the channel hole between the vertical electrode and the stacked structure; and
   a plurality of resistance changeable structures disposed on a surface of each of the horizontal electrodes and in contact with the selector element in the channel hole, wherein each of the resistance changeable structures comprises:
     a storage layer;
     an oxide layer disposed between the storage layer and the selector element; and
     a barrier layer disposed between the storage layer and the surface of each of the horizontal electrodes;
   wherein the selector element comprises:
     a gate layer in contact with the at least one vertical electrode;
     a channel layer in contact with the oxide layer; and
     a gate insulating layer disposed between the channel layer and the gate layer.

2. The resistive random access memory according to claim 1, wherein the selector element further comprises:
   a first conductive type doped region formed in the channel layer at a first end of the channel hole, wherein the channel layer has a second conductive type; and
   a first conductive type epitaxial layer formed at a second end of the channel hole, the first conductive type epitaxial layer is in contact with the channel layer and is isolated from the gate layer by the gate insulating layer, wherein the gate layer has the first conductive type.

3. The resistive random access memory according to claim 2, wherein the first conductive type is N type and the second conductive type is P type.

4. The resistive random access memory according to claim 2, wherein the first conductive type is P type and the second conductive type is N type.

5. A manufacturing method of a resistive random access memory, comprising:
    forming a stacked structure comprising a plurality of first dielectric layers and a plurality of second dielectric layers stacked alternately, wherein the first dielectric layer and the second dielectric layer have different etch rates;
    forming at least one channel hole in the stacked structure, the channel hole extends through the plurality of first dielectric layers and the plurality of second dielectric layers;
    conformally forming a selector element on an inner surface of the at least one channel hole;
    forming a vertical electrode in the at least one channel hole;
    removing the plurality of second dielectric layers in the stacked structure and exposing a portion of the selector element;
    conformally forming a plurality of resistance changeable structures on a surface of the plurality of first dielectric layers and an exposed surface of the selector element in the stacked structure, the plurality of resistance changeable structures is in contact with the selector element in the channel hole; and
    forming a plurality of horizontal electrodes between the plurality of first dielectric layers.

6. The manufacturing method of a resistive random access memory according to claim 5, wherein the step of forming the resistance changeable structures comprises: sequentially forming an oxide layer, a storage layer, and a barrier layer on the surface of the plurality of first dielectric layers and the exposed surface of the selector element.

7. The manufacturing method of a resistive random access memory according to claim 5, wherein the selector element comprises: a transition metal oxide (TMO) selector element, an ovonic threshold switching (OTS) selector element, an metal/silicon/metal (MSM) selector element, or a mixed ionic electronic conduction (MIEC) diode.

8. The manufacturing method of a resistive random access memory according to claim 5, wherein the step of forming the selector element comprises: sequentially forming a channel layer, a gate insulating layer, and a gate layer on the inner surface of the at least one channel hole.

9. The manufacturing method of a resistive random access memory according to claim 8, wherein the step of forming the selector element further comprises:
    forming a first conductive type epitaxial layer at a first end of the channel hole before forming the channel layer; and
    doping the channel layer at a second end of the channel hole after forming the channel layer to form a first conductive type doped region, wherein the channel layer has a second conductive type.

10. The manufacturing method of a resistive random access memory according to claim 9, wherein the first conductive type is N type and the second conductive type is P type.

11. The manufacturing method of a resistive random access memory according to claim 9, wherein the first conductive type is P type and the second conductive type is N type.

12. The manufacturing method of a resistive random access memory according to claim 5, wherein when the at least one channel hole is a plurality of channel holes, the step after forming the vertical electrode further comprises removing the stacked structure between each pair of the channel holes and retaining the stacked structure in a portion surrounding the channel holes where the plurality of horizontal electrodes is to be formed.

* * * * *